United States Patent [19]

Hao et al.

[11] Patent Number: 5,786,254
[45] Date of Patent: Jul. 28, 1998

[54] HOT-CARRIER RELIABILITY IN SUBMICRON MOS DEVICES BY OXYNITRIDATION

[75] Inventors: Ming-yin Hao, Sunnyvale; Rajat Rakkhit, Milpitas, both of Calif.

[73] Assignee: Advanced Micro Devices, Inc., Sunnyvale, Calif.

[21] Appl. No.: 821,121

[22] Filed: Mar. 19, 1997

[51] Int. Cl.$^6$ .......................... H01L 21/265; H01L 21/336
[52] U.S. Cl. .................... 438/287; 438/769; 438/770
[58] Field of Search ....................... 438/216, 261, 438/287, 769–770, 775

[56] References Cited

U.S. PATENT DOCUMENTS

| | | |
|---|---|---|
| 5,382,533 | 1/1995 | Ahmad et al. |
| 5,567,651 | 10/1996 | Berti et al. .......................... 438/303 |
| 5,591,681 | 1/1997 | Wristers et al. ....................... 438/264 |
| 5,650,344 | 7/1997 | Ito et al. ......................... 148/DIG. 43 |

OTHER PUBLICATIONS

Impact of Surface Proximity Gettering and Nitrided Oxide Side–Wall Spacer by Nitrogen Implantation on Sub–Quarter Micron CMOS LDD FETs by S. Shimizu, T.Kuroi, Y. Kawasaki, S. Kusunoki, Y.Okumura, M. Inuishi and H. Miyoshi, 1995 IEEE, IEDM 95–859.

*Primary Examiner*—John Niebling
*Assistant Examiner*—Richard A. Booth
*Attorney, Agent, or Firm*—H. Donald Nelson

[57] ABSTRACT

A method of manufacturing a semiconductor device with reduced hot-carrier induced degradation wherein a nitrogen species is introduced into the gate oxide layer. The introduction of the nitrogen species may be done after the gate etch, after the spacer material deposition, or after the spacer etch. The nitrogen species may also be introduced into the gate oxide after both the gate etch and the spacer material deposition or after both the gate etch and the spacer etch or after all three steps.

3 Claims, 9 Drawing Sheets

HOT-CARRIER RELIABILITY IN SUBMICRON MOS DEVICES BY OXYNITRIDATION

BACKGROUND OF THE INVENTION

1. Field of the Invention

This invention relates generally to a method of manufacturing high performance submicron semiconductor devices having improved hot-carrier reliability and more specifically, to a method of manufacturing high performance semiconductor devices having improved hot-carrier reliability achieved by oxynitridation. The oxynitridation can be done after polysilicon gate etch and/or after spacer formation and/or after spacer etch.

2. Discussion of the Related Art

The semiconductor industry is characterized by the dual requirements of an increase in the speed of integrated circuits and an increase in the density of elements in those integrated circuits. These two requirements have thus become the two major goals of the design and manufacturing efforts concerned with MOSFETs and other semiconductor devices, such as volatile and nonvolatile memory devices. Increasing the density of elements in integrated circuits means that smaller channel lengths and widths have to be used. As the dimensions of semiconductor devices decreased, the existing "long-channel" performance models for MOSFET devices predicted that a decrease in the channel length, L, or the gate oxide thickness, $T_{ox}$, would increase $I_{DSAT}$. However, as MOSFET devices were scaled below approximately 2 μm, effects not predicted by the long channel models were observed and were thereafter termed "short-channel" effects.

As device dimensions of MOSFETs continued to decrease, it was determined that problems associated with the short-channel effects could be placed in two general categories: (1) the problem of increased leakage current when the MOSFET is off and (2) reliability problems associated with short-channel and thin gate oxide device structures.

Some of the reliability problems that arise in short-channel and thin gate oxide MOSFETs include; (1) thin gate oxide breakdown, (2) device degradation due to hotcarrier effects, and (3) reliability problems associated with interconnects between MOSFETs. The problem that is of particular interest is device degradation due to hot-carrier effects.

The characteristics of the Si—$SiO_2$ interface determine, to a great extent, the functioning of the gate dielectric. A study of the structure of the interface has resulted in the development of the concept of surface states and interface trapped charge and the development of a theoretical determination of their effect on the threshold voltage of MOSFET devices.

The term "surface states" refers to new electronic energy states that arise in a crystal if the crystal lattice is terminated at a surface such as the surface existing at the Si—$SiO_2$ interface. At the interface, there are "dangling bonds" which are locations at which atoms do not have adjacent atoms to share available bonds. These dangling bonds are also known as surface states and are confined to the region adjacent to the surface or to the interface. Each of the surface states is associated with a single atom at the surface or the interface and therefore an electron occupying one of the surface states is considered to be localized since the electron is forced to remain in a restricted region of space centered around the atom. Because such states effectively trap free carriers at the surface or at the interface, they are also called interface traps.

Although the theoretical basis of the interface traps is accepted and the electrical behavior of the interface traps can be predicted, the physical origin of the surface states is not known exactly. The current view is that the surface states arise primarily from the unsatisfied or dangling bonds at the silicon surface. In an ideal Si—$SiO_2$ interface, it is theoretically possible that all the dangling bonds in the silicon at the interface can be tied up by the formation of $SiO_2$. However, if only a small number of these bonds are not tied up, a significant number of surface states can exist. This is because on a silicon surface there can be as many as $6.8 \times 10^{14}$ silicon atoms per $cm^2$. If, for example, there are 1/1000 of these bonds dangling, the density of interface trapped charges is approximately $6.8 \times 10^{11}/cm^2$. With a gate oxide thickness of 20 nm, this number of dangling bonds can cause the threshold voltage to shift by approximately 0.63 volts. This example indicates that if the dangling bond theory is correct, a relatively small number of residual dangling bonds can significantly perturb the device characteristics. One reason for the perturbation of the device characteristics is that the unoccupied chemical bonding sites clutch at free electrons causing a resistance to the flow of current, slowing the transistors, and damaging the transistors with the heat generated.

The hot-carrier effects are of increasing importance when MOSFETs are scaled into the submicron range. The hot-carrier effects are encountered when the MOSFET device dimensions are reduced and the supply voltage remains constant or is not reduced in proportion to the reduction in the device dimensions. In this event, the lateral electric field in the channel increases which causes the inversion-layer charges to be accelerated (heated) to an extent that they cause a number of harmful device phenomena, that is, the hot-carrier effects. The most important hot-carrier effect is the damage inflicted to the gate oxide and the Si—$SiO_2$ interface. This leads to a time-dependent degradation of various MOSFET characteristics, including threshold voltage, linear region transconductance, subthreshold slope, and saturation current. The lifetimes of conventional MOSFET structures when subject to such degradation can be reduced below the generally accepted benchmark of 10 years. This degradation has been observed in NMOS devices with channel lengths smaller than 1.5 μm, and in PMOS devices with submicron channel lengths. Because of the hot-carrier effects upon the performance of MOSFETs it has become imperative to develop techniques to counteract this problem.

One of the hot-carrier effects is that the hot carriers exacerbate the effects of the dangling bonds discussed above. In an attempt to "tie up" the dangling bonds, an anneal in a hydrogen ambient at approximately 400° C. is normally the last step prior to assembly and packaging of the integrated circuits. The theory behind the hydrogen anneal is that the hydrogen penetrates the gate oxide and ties up the remaining dangling bonds at the Si—$SiO_2$ by forming Si—H bonds and in some cases by forming Si—OH bonds. However, the Si—H or Si—OH bonds can be easily broken by injected hot electrons (hot carriers), giving rise to additional interface traps.

It has also been found that large quantities of hydrogen accelerate hot-electron aging effects in MOS devices. In addition, excess hydrogen at the Si—$SiO_2$ interface is also thought to be a cause of an increase in density of the interface states. Although hydrogen is used to fill dangling bonds by forming Si—H or Si—OH bonds at the interface, injected hot electrons as discussed above easily break the bonds. Excess hydrogen introduced during processing diffuses to the interface and causes increased bond-breaking behavior rather than enhancing the stability of the dangling bonds.

Another effect that has been shown to increase the hot-carrier induced degradation is damage caused to the edge of the gate oxide during the polysilicon gate etch step. This damage occurs even though the polysilicon gate etch is done by a plasma dry etch which is substantially an anisotropic process and theoretically should not damage the gate oxide during the polysilicon gate etching process. The damage at the edges of the gate oxide increases the surface states at the edges of the gate oxide that results in an increase of the surface states (interface trap states) at the interface between the substrate and the sidewall. The prior art has developed a method of improving reliability in sub-quarter micron CMOS devices by implanting nitrogen into the source/drain regions. This technique suppresses the hot-carrier degradation for LDD FETs, since the segregation of nitrogen at the interface between the substrate and the sidewall spacers reduces the interface state generation under the sidewall spacers in the source/drain regions. However, this technique does not address the damage done to the gate oxide during the gate etch process.

Therefore, what is needed is a method of manufacturing a semiconductor device in which the damage to the edges of the gate oxide is removed.

SUMMARY OF THE INVENTION

The present invention is directed to a method of manufacturing a semiconductor device with reduced hot-carrier induced degradation by introducing a nitrogen species into the gate oxide layer.

The introduction of the nitrogen species into the gate oxide layer is accomplished by oxynitridation.

The oxynitridation can be done with pure $N_2O$ or NO, dilute (with inert gases) $N_2O$ or NO ambient, or in the mixture of any combination of $N_2O$, NO or $O_2$. $NH_3$ can also be used with any of the above oxidizing ambient.

The introduction of the nitrogen species into the gate oxide layer can be done after the gate has been etched and before the formation of the spacer material.

The introduction of the nitrogen species into the gate oxide layer can be done after the spacer material has been formed.

The introduction of the nitrogen species into the gate oxide layer can be done after the spacer material has been etched.

The introduction of the nitrogen species into the gate oxide layer can be done after gate etch and after spacer material deposition or after gate etch and after spacer etch.

The introduction of the nitrogen species into the gate oxide layer can be done after gate etch, after spacer material deposition and after spacer etch.

The present invention is better understood upon consideration of the detailed description below, in conjunction with the accompanying drawings. As will become readily apparent to those skilled in the art from the following description, there is shown and described an embodiment or embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Reference is now made in detail to specific embodiments of the present invention that illustrate the best mode presently contemplated by the inventors for practicing the invention.

Figure 1A:
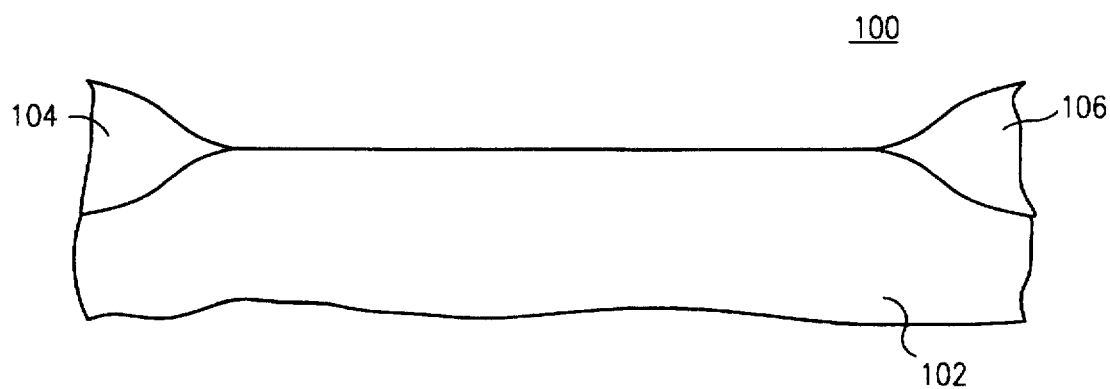
FIGS. 1A–1G show selected steps in a method of manufacturing a prior art semiconductor device.

FIGS. 1A–1G show the structure and selected steps in a method of manufacturing a prior art semiconductor device 100. Like numerical designations are used in each of the subsequent figures for like elements. FIG. 1A shows a semiconductor substrate 102 with isolation structures 104 and 106 formed on the surface of the semiconductor substrate 102. The isolation structures 104 and 106 could be silicon dioxide trench structures or field oxide (FOX) structures as shown in FIGS. 1A–1G. The method of forming such isolation structures is well known in the semiconductor manufacturing art and will not be discussed.

Figure 1B:
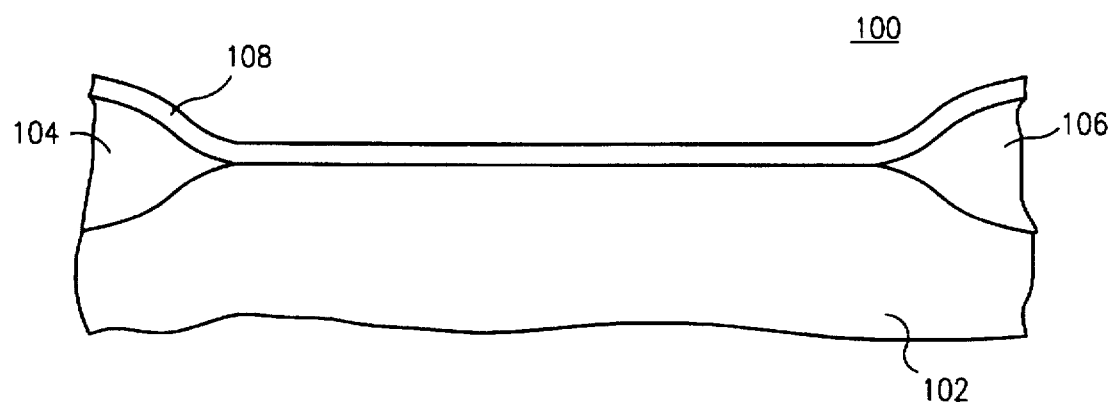

FIG. 1B shows the semiconductor device 100 as shown in FIG. 1A with a gate oxide layer 108 formed on the surface of the semiconductor device 100.

Figure 1C:
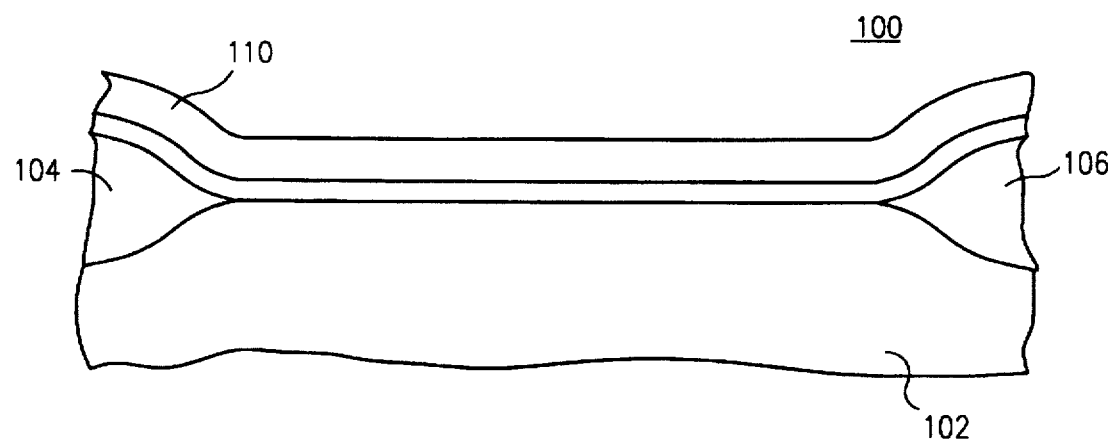

FIG. 1C shows the semiconductor device 100 as shown in FIG. 1B with a layer of polysilicon 110 formed on the entire surface of the semiconductor device 100. The method of forming polysilicon material on a semiconductor device is well known in the semiconductor manufacturing art and will not be discussed.

Figure 1D:
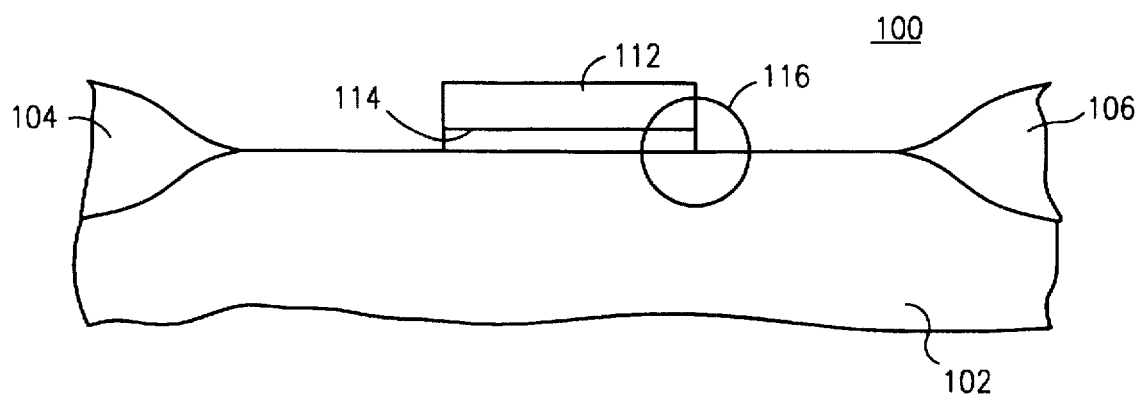
Figure 1E:
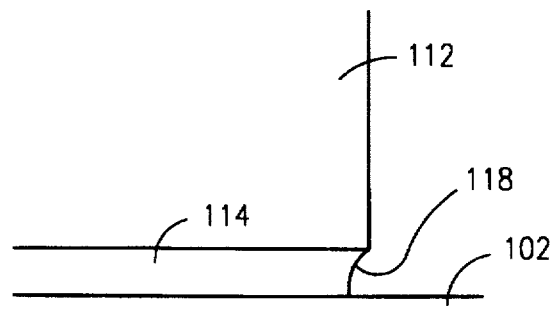

FIG. 1D shows the semiconductor device 100 as shown in FIG. 1C with the layer of polysilicon 110 etched to form the polysilicon gate 112 with the gate oxide 114 between the polysilicon gate 112 and the semiconductor substrate 102. The typical method of performing the gate etch is by plasma dry etching. The plasma dry etch is used because it is anisotropic and should not undercut the gate oxide material. However, it has been shown that the plasma dry etch step does, in fact, cause damage to the gate oxide layer. A portion of the semiconductor device 100 is shown in circle 116 and is shown enlarged in FIG. 1E. Although it is impossible to show the details of the damage done to the gate oxide, it has been shown that damage occurs to the gate oxide caused by the polysilicon gate etch process. FIG. 1E depicts the gate oxide 114 shown partially damaged at 118 as a result of the gate etch process.

Figure 1F:
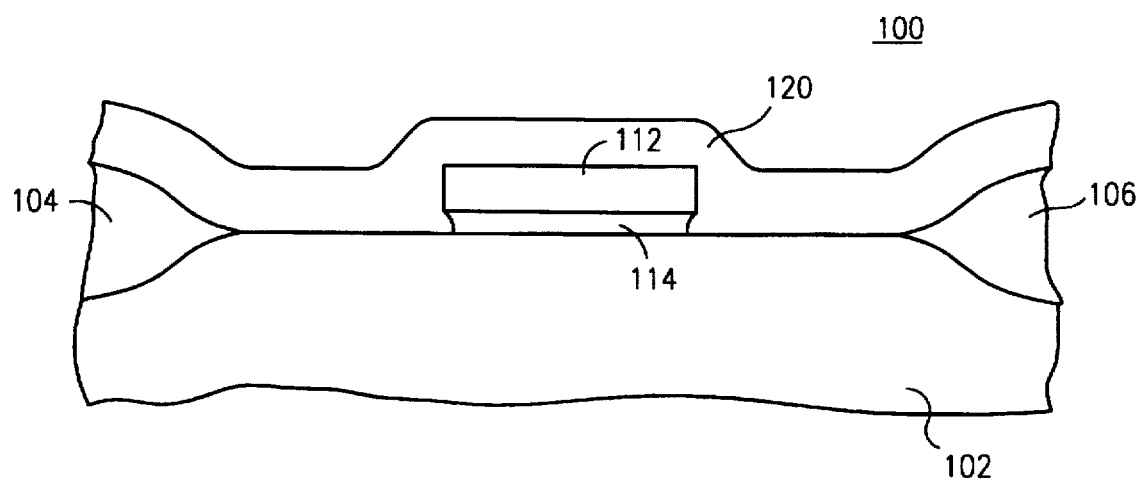

FIG. 1F shows the semiconductor device 100 as shown in FIG. 1D with a layer of sidewall spacer material 120 formed on the semiconductor device 100. The method of forming a layer of sidewall spacer material is well known in the semiconductor manufacturing art and will not be discussed.

Figure 1G:
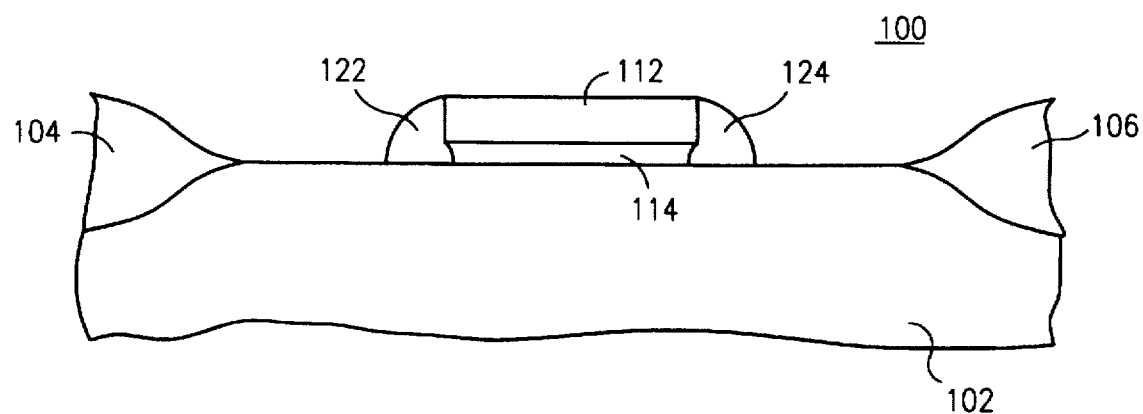

FIG. 1G shows the semiconductor device 100 as shown in FIG. 1F with the layer of sidewall spacer material 120 etched to form the sidewall spacers 122 and 124. The method of etching the sidewall spacer material 120 to form the sidewall spacers 122 and 124 is well known in the semiconductor manufacturing art and will not be discussed.

Figure 2A:
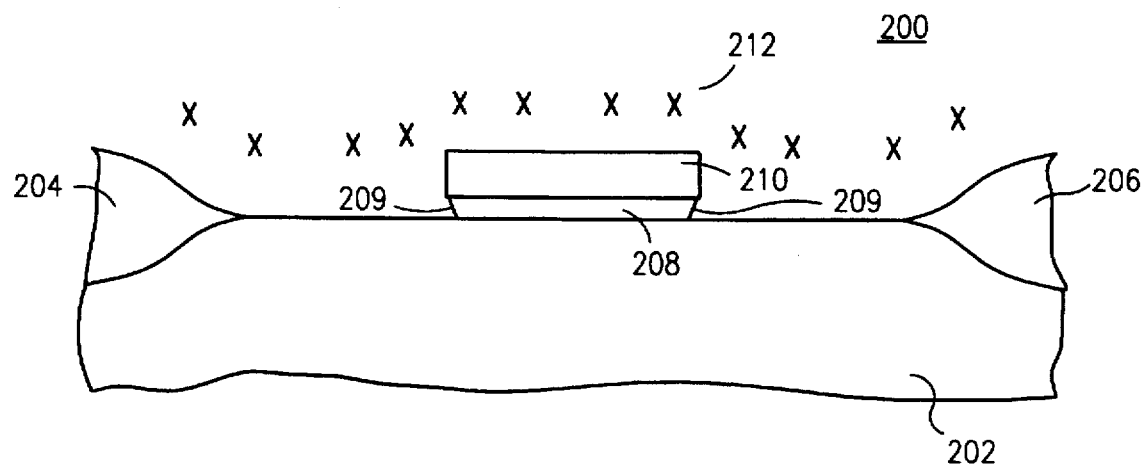
FIGS. 2A–2C show selected steps in a method of manufacturing a semiconductor device in accordance with the present invention in which the step of oxynitridation is done after the step of etching the gate.
Figure 2B:
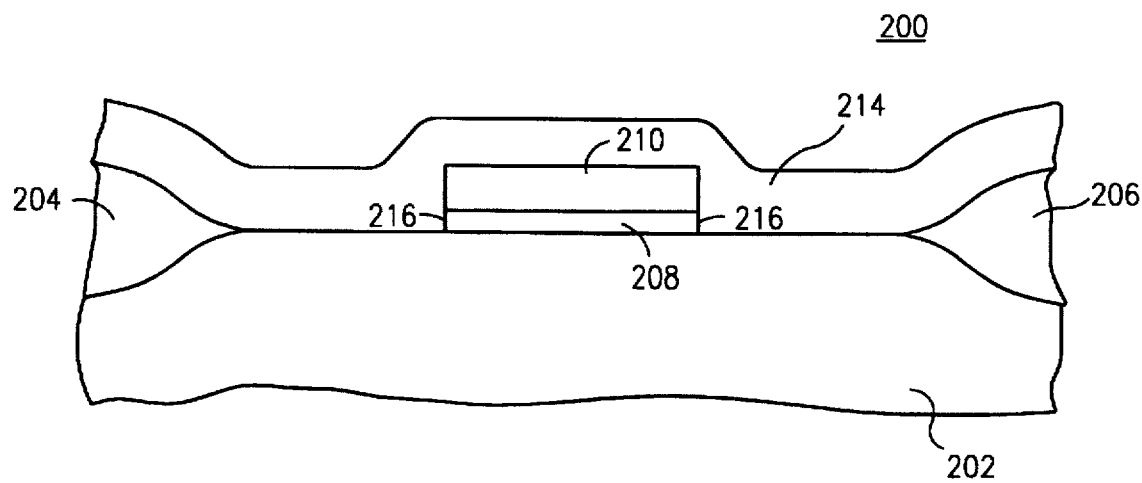
Figure 2C:
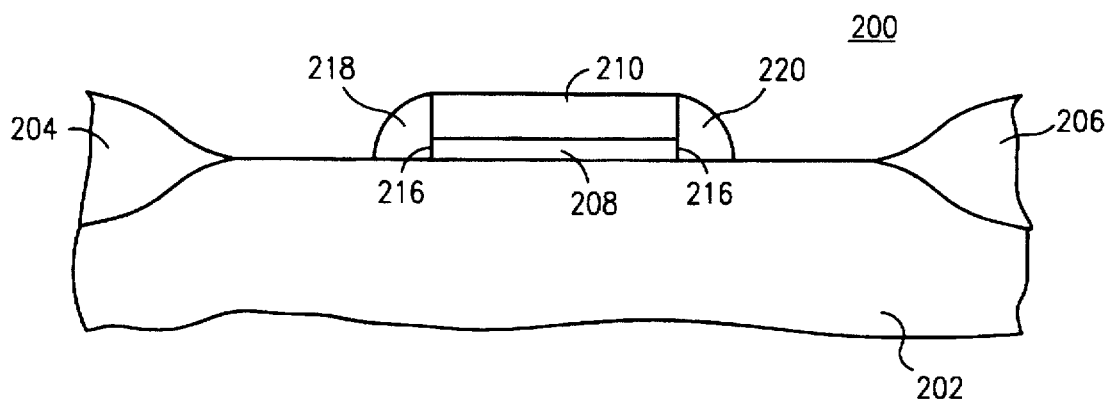

FIGS. 2A–2C show the structure and selected steps in a first method of manufacturing a semiconductor device 200 in accordance with the present invention. Like numerical designations are used in each of the subsequent figures for like elements. FIG. 2A shows a semiconductor substrate 202, with isolation regions 204 and 206 formed on the surface of the semiconductor substrate 202, a gate oxide layer 208, and a polysilicon gate 210 formed on the gate oxide layer 208. The damage to the gate oxide 208 is indicated at 209. An oxynitridation step is performed on the semiconductor device 200. The oxynitridation step is represented by the symbol X at 212. The X symbol 212 represents one of the following: an oxynitridation in pure $N_2O$ (nitrous oxide) or NO (nitric oxide), a dilute $N_2O$ or NO ambient, or in a mixture of any combination of $N_2O$, NO, or $O_2$. $NH_3$ may also be used with any of the above oxidizing ambients. The oxynitridation step is carried out at a high temperature which will introduce nitrogen species into the gate oxide and remove some of the damage in the gate oxide caused by the etch process of the polysilicon.

FIG. 2B shows the semiconductor device 200 shown in FIG. 2A after the oxynitridation step and with a spacer material 214 formed on the semiconductor device 200. The removal of the damage in the gate oxide is indicated at 216.

FIG. 2C shows the semiconductor device 200 shown in FIG. 2B after the spacer material 214 has been etched to form sidewall spacers 218 and 220.

Figure 3A:
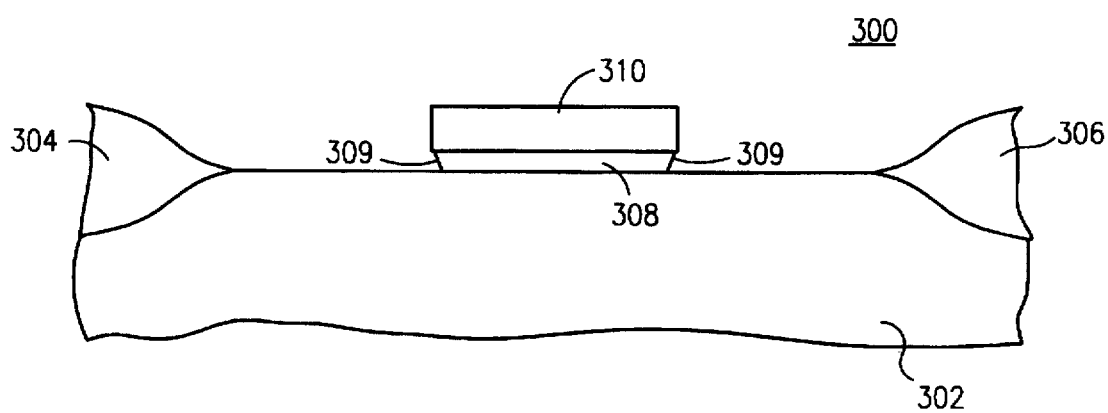
FIGS. 3A–3C show selected steps in a method of manufacturing a semiconductor device in accordance with the present invention in which the step of oxynitridation is done after the step of spacer material deposition.
Figure 3B:
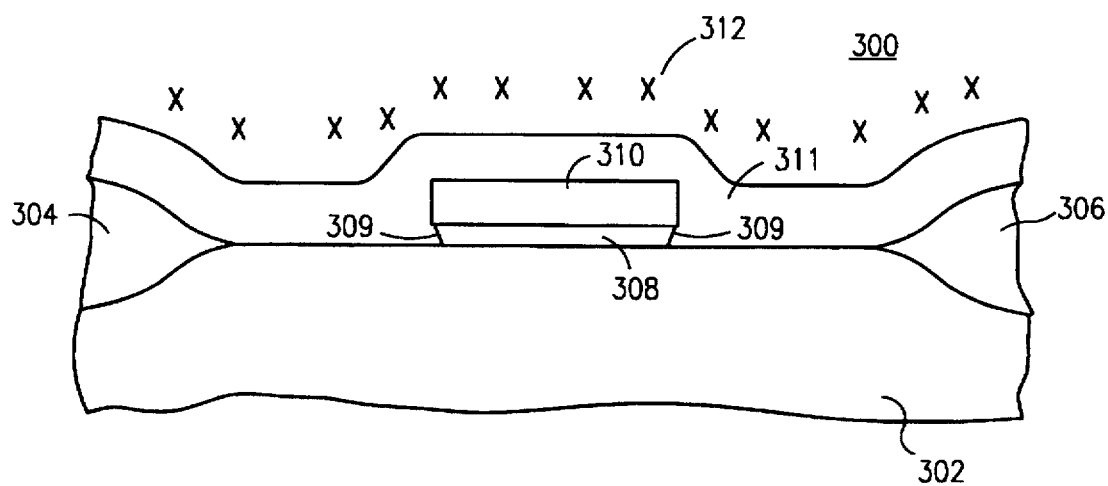
Figure 3C:
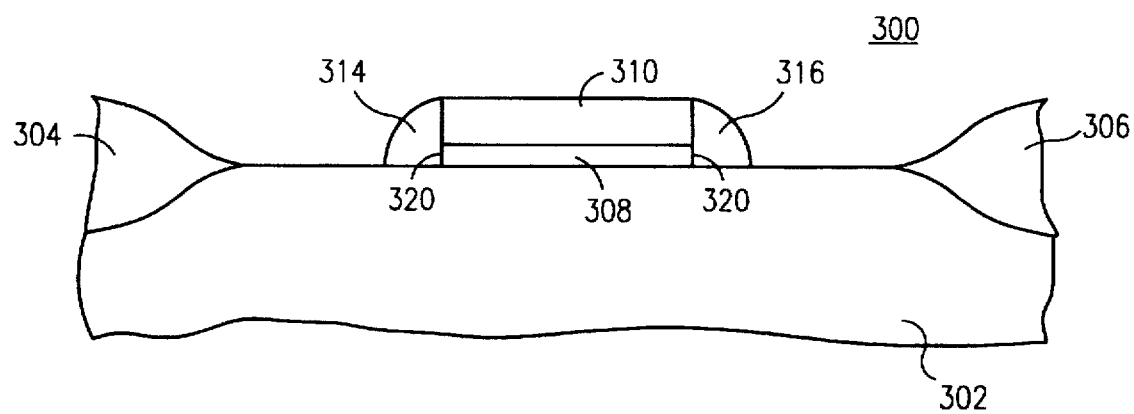

FIGS. 3A–3C show the structure and selected steps in a second method of manufacturing a semiconductor device 300 in accordance with the present invention. Like numerical designations are used in each of the subsequent figures for like elements. FIG. 3A shows a semiconductor substrate 302, with isolation regions 304 and 306 formed on the surface of the semiconductor substrate 302, a gate oxide layer 308, and a polysilicon gate 310 formed on the gate oxide layer 308. The damage to the gate oxide 308 is indicated at 309.

FIG. 3B shows a layer of spacer material 311 formed on the semiconductor device 300. An oxynitridation step is performed on the semiconductor device 300 after the spacer material 311 is formed on the semiconductor device 300. The oxynitridation step is represented by the symbol X at 312. The X symbol 312 represents one of the following: an oxynitridation in pure $N_2O$ (nitrous oxide) or NO (nitric oxide), a dilute $N_2O$ or NO ambient, or in a mixture of any combination of $N_2O$, NO, or $O_2$. $NH_3$ may also be used with any of the above oxidizing ambients. The oxynitridation step is carried out at a high temperature that will introduce nitrogen species into the spacer material which will densify the spacers. The nitrogen migrates down to the gate oxide 308 region and remove the damage in the gate oxide such as that indicated at 309 which will improve the gate oxide integrity. Such a high temperature annealing process can be performed in an atmospheric furnace or as an RTA (rapid thermal anneal) process.

FIG. 3C shows the semiconductor device 300 shown in FIG. 3B after the oxynitridation step and with the spacer material 310 etched to form sidewall spacers 314 and 316. The removal of the damage to the gate oxide is indicated at 320.

Figure 4A:
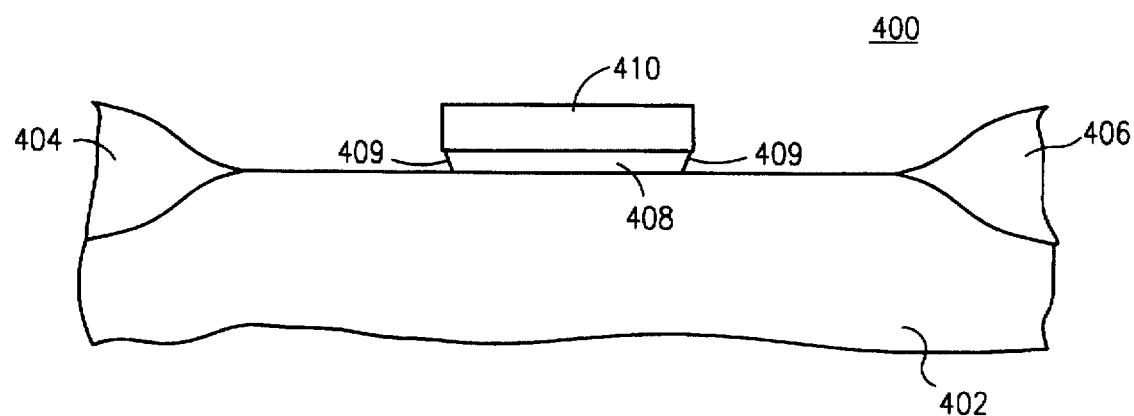
FIGS. 4A–4E show selected steps in a method of manufacturing a semiconductor device in accordance with the present invention in which the step of oxynitridation is done after the step of spacer etch.

FIGS. 4A–4E show the structure and selected steps in a third method of manufacturing a semiconductor device 400 in accordance with the present invention. Like numerical designations are used in each of the subsequent figures for like elements. FIG. 4A shows a semiconductor substrate 402, with isolation regions 404 and 406 formed on the surface of the semiconductor substrate 402, a gate oxide layer 408, and a polysilicon gate 410 formed on the gate oxide layer 408. The damage to the gate oxide 408 is indicated at 409.

Figure 4B:
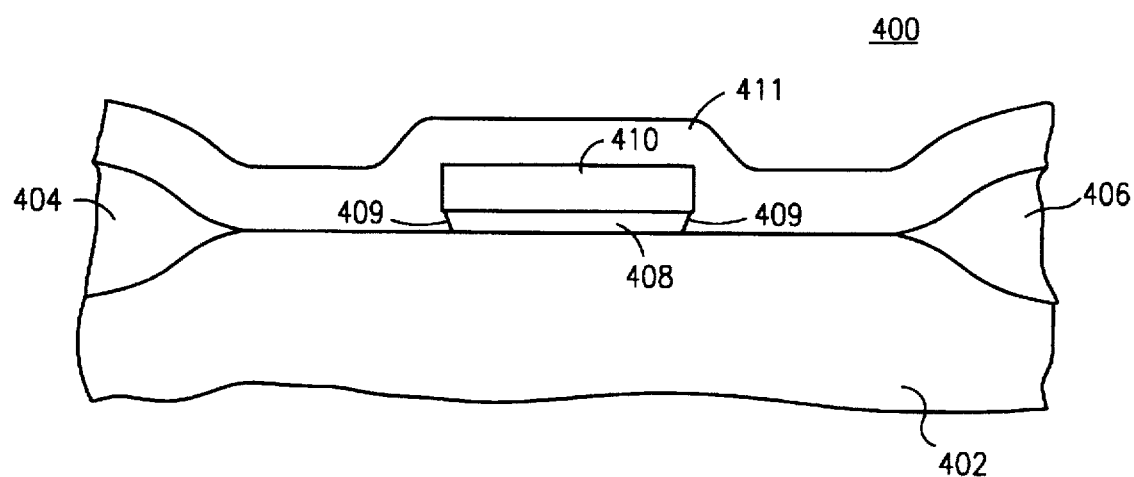

FIG. 4B shows the semiconductor device 400 as shown in FIG. 4A with a layer of spacer material 411 formed on the semiconductor device 400.

Figure 4C:
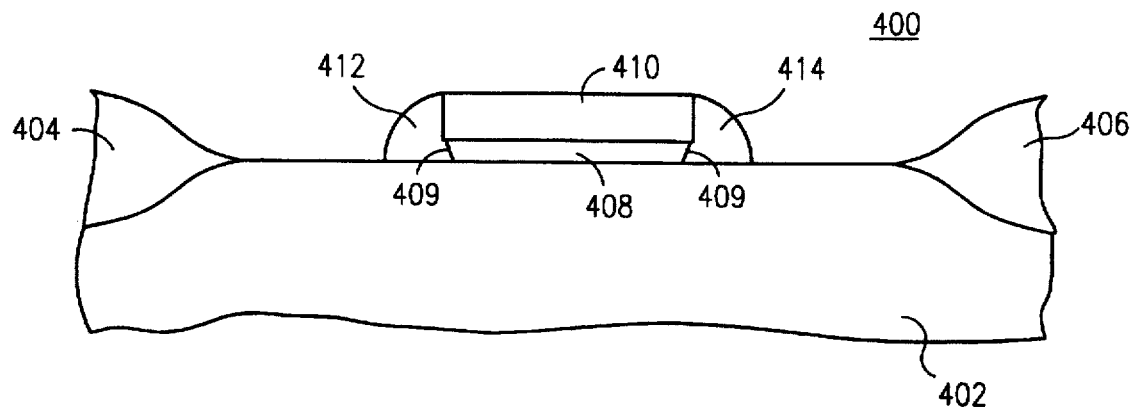

FIG. 4C shows the semiconductor device 400 as shown in FIG. 4B with the spacer material 411 etched to form sidewall spacers 412 and 414.

Figure 4D:
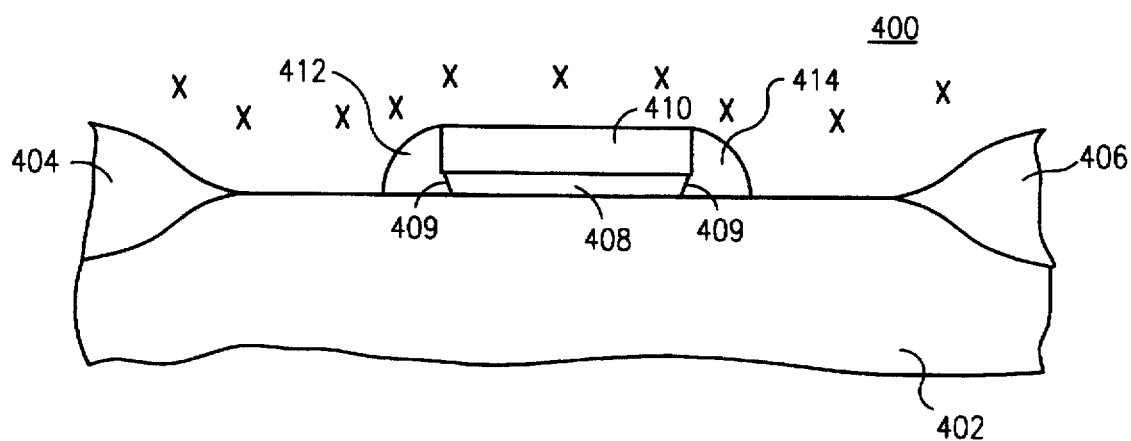

FIG. 4D shows the semiconductor device 400 as shown in FIG. 4C with an oxynitridation step being performed. The oxynitridation step is represented by the symbol X at 416. The X symbol 412 represents one of the following: an oxynitridation in pure $N_2O$ (nitrous oxide) or NO (nitric oxide), a dilute $N_2O$ or NO ambient, or in a mixture of any combination of $N_2O$, NO, or $O_2$. $NH_3$ may also be used with any of the above oxidizing ambients. The oxynitridation step is carried out at a high temperature that will introduce nitrogen species into the spacer material that will densify the spacers. The nitrogen migrates down to the gate oxide 408 region and remove the damage in the gate oxide such as that indicated at 409 which will improve the gate oxide integrity. In addition, the oxidizing ambient will also assists in removing passivants formed during the spacer etch process. Such a high temperature annealing process can be performed in an atmospheric furnace or as an RTA (rapid thermal anneal) process.

Figure 4E:
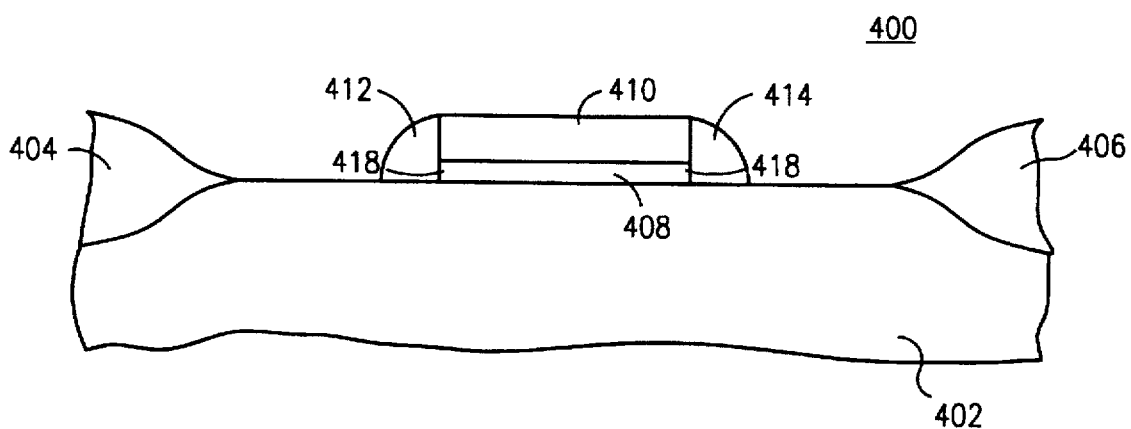

FIG. 4E shows the semiconductor device 400 as shown in FIG. 4D after the oxynitridation is complete. The damage to the gate oxide is indicated as being removed at 418.

Figure 5:
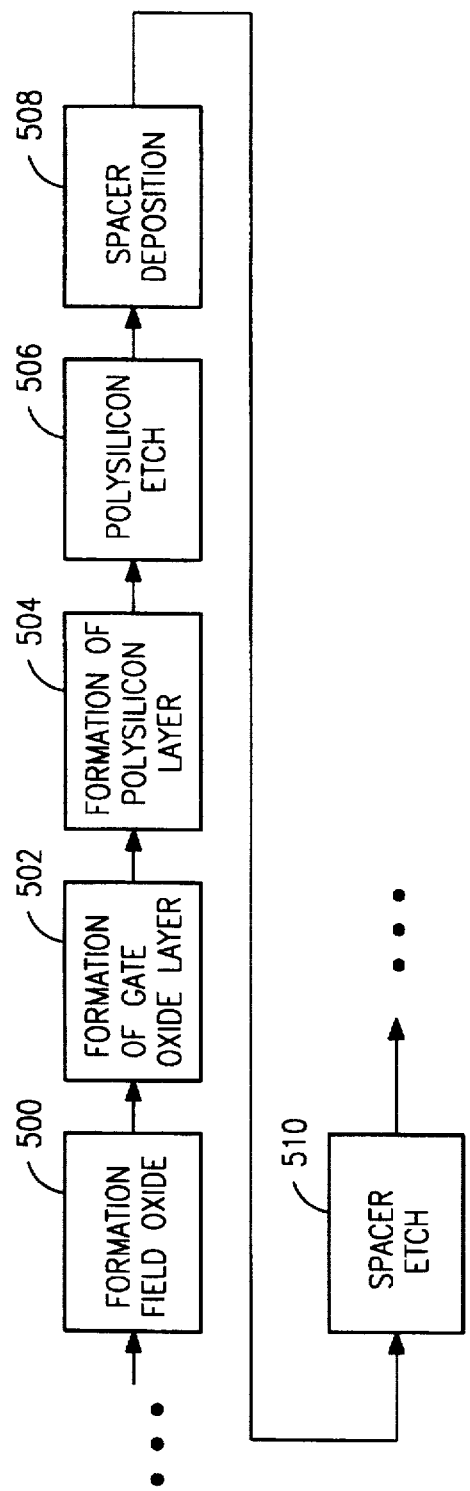
FIG. 5 shows a flow diagram of selected steps in a process for the manufacturing of a prior art semiconductor device.

FIG. 5 is a process flow diagram showing selected steps of a process to manufacture a prior art semiconductor device. The selected steps shown begin with the formation 500 of the field oxide isolation regions, the formation 502 of the gate oxide layer, the formation 504 of the polysilicon layer, the polysilicon etch 506, the formation of the spacer material 508, and the spacer etch 510.

Figure 6:
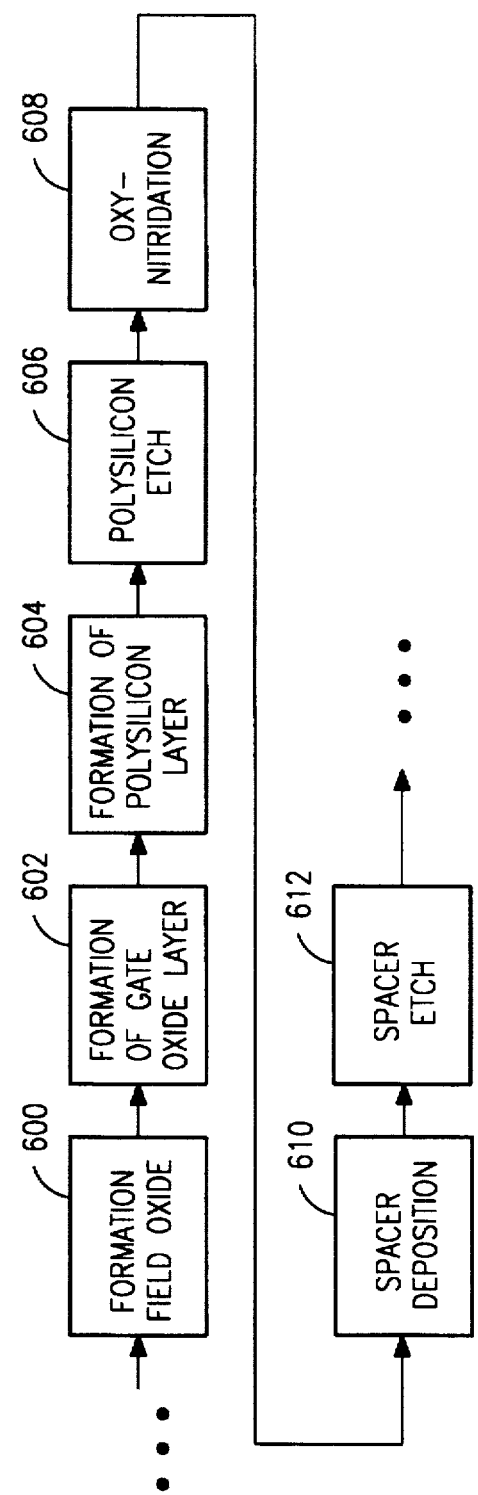
FIG. 6 shows a flow diagram of selected steps in a process in accordance with the present invention in which the step of oxynitridation is done after the step of polysilicon etch.

FIG. 6 is a process flow diagram showing selected steps of a first process to manufacture a semiconductor device in accordance with the present invention. The selected steps shown begin with the formation 600 of the field oxide isolation regions, the formation 602 of the gate oxide layer, the formation 604 of the polysilicon layer on the semiconductor device, the step of etching 606 the polysilicon layer to form the polysilicon gates, the oxynitridation step 608 performed after the polysilicon gates have been formed, the spacer material deposition 610, and the step of etching the spacer material 612 to form the sidewall spacers.

Figure 7:
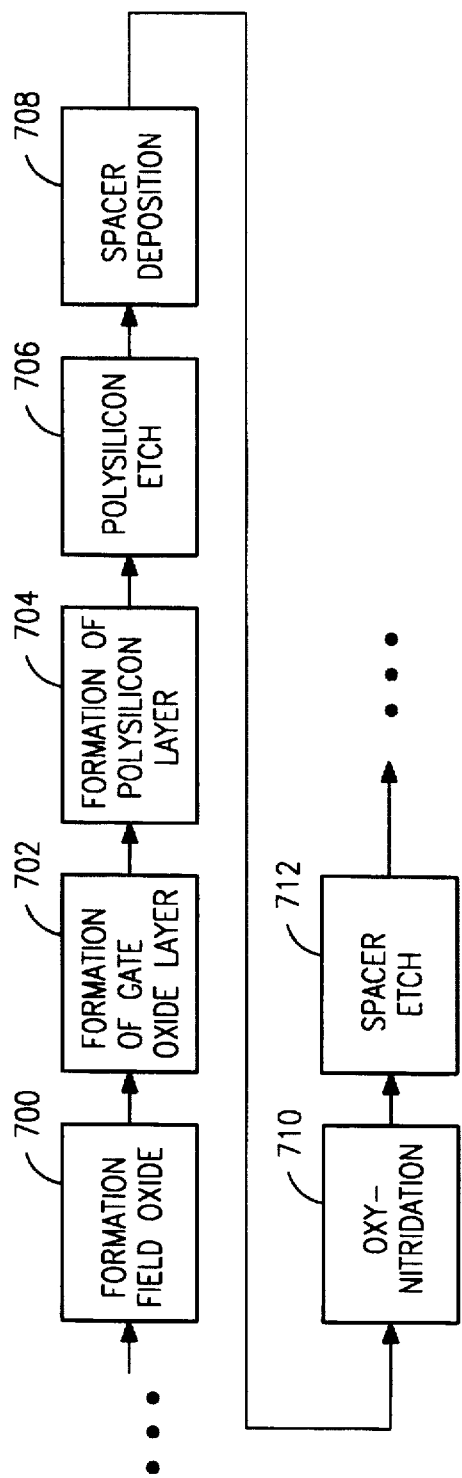
FIG. 7 shows a flow diagram of selected steps in a process in accordance with the present invention in which the step of oxynitridation is done after spacer deposition.

FIG. 7 is a process flow diagram showing selected steps of a second process to manufacture a semiconductor device in accordance with the present invention. The selected steps shown begin with the formation 700 of the field oxide isolation regions, the formation 702 of the gate oxide layer, the formation 704 of the polysilicon layer on the semiconductor device, the step 706 of etching the polysilicon layer to form the polysilicon gates, the spacer material deposition 708, the oxynitridation step 710 performed after the spacer material deposition, and the spacer etch step 712.

Figure 8:
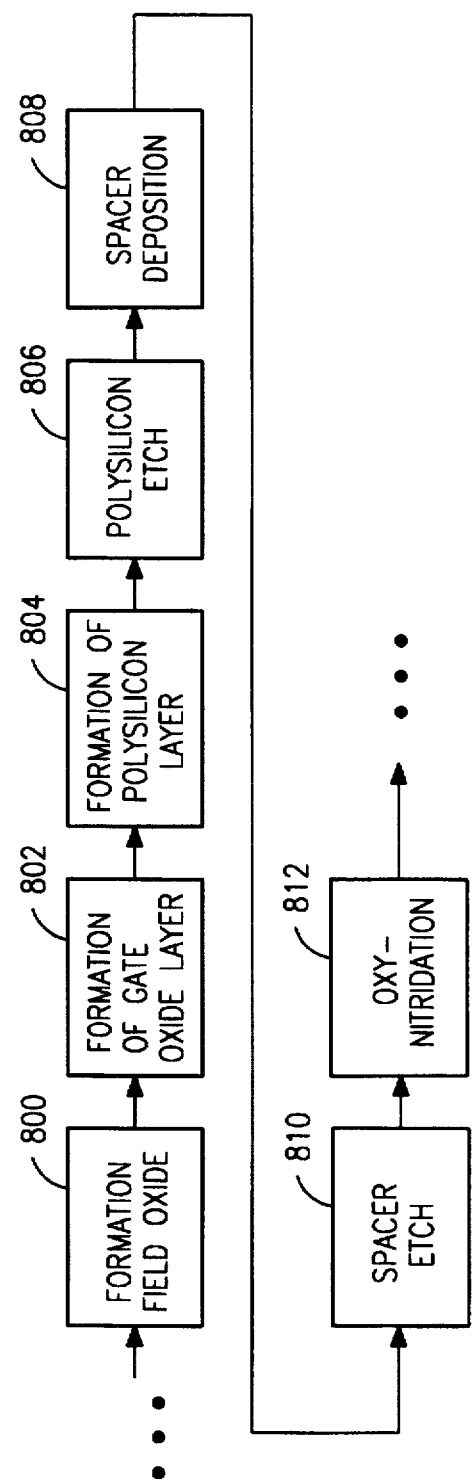
FIG. 8 shows a flow diagram of selected steps in a process in accordance with the present invention in which the step of oxynitridation is done after the step of spacer etch.

FIG. 8 is a process flow diagram showing selected steps of a third process to manufacture a semiconductor device in accordance with the present invention. The selected steps shown begin with the formation 800 of the field oxide isolation regions, the formation 802 of gate oxide, the formation 804 of the polysilicon layer, the step of polysilicon etch 806, the step of spacer deposition 808, the step of spacer etch 810, and the oxynitridation step 812.

Figure 9:
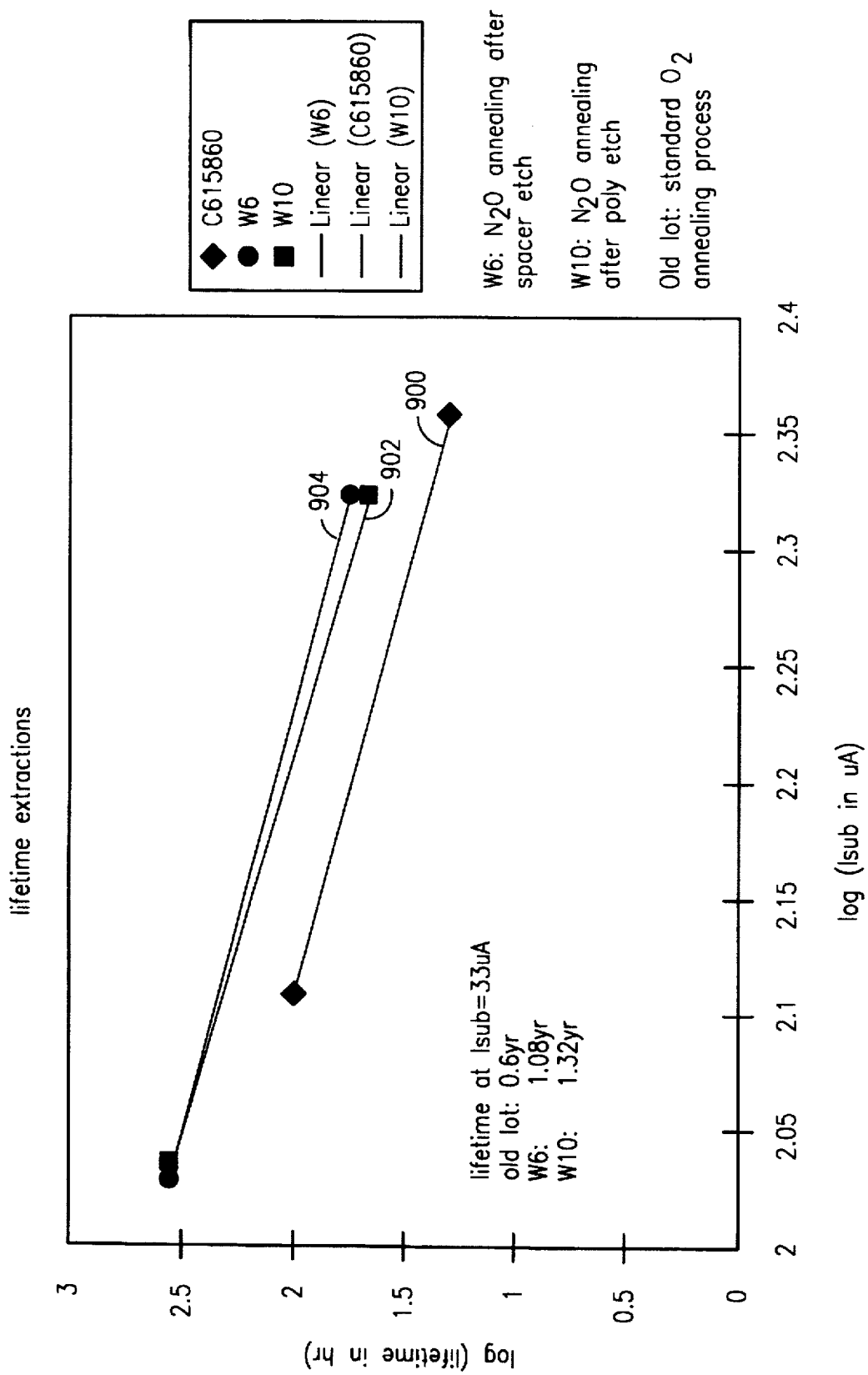
FIG. 9 illustrates experimental results showing the increase in lifetime of semiconductor devices manufactured in accordance with the present invention.

FIG. 9 is a graphical representation of experimental data showing the increase in lifetime of semiconductor devices manufactured in accordance with the present invention. Data 900 from prior art semiconductor devices is compared with data 902 from semiconductor devices manufactured in accordance with the present invention with an $N_2O$ oxynitridation performed after the polysilicon etch and with data 904 from semiconductor devices manufactured in accordance with the present invention with an N2O oxynitridation performed after the spacer etch step.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is we claim is:

1. A method of manufacturing a semiconductor device with reduced hot-carrier induced degradation, the method comprising:

forming a layer of gate oxide on a surface of a semiconductor substrate;

forming a layer of polysilicon on the layer of gate oxide;

removing a portion of the layer of polysilicon forming a gate structure of polysilicon overlying a layer of gate oxide;

removing the gate oxide layer from the surface of the semiconductor substrate not underlying the gate structure;

forming a layer of a spacer material on the gate and semiconductor substrate;

etching the layer of a spacer material to form sidewall spacers;

introducing a nitrogen species into the gate oxide layer after the layer of spacer material has been etched.

2. The method of claim 1, wherein introducing a nitrogen species into the gate oxide layer is accomplished by oxynitridation.

3. The method of claim 2, wherein the nitrogen species is selected from the group consisting of $N_2O$, NO, a dilute $N_2O$ or NO ambient with inert gases, and any mixture of $N_2O$, NO, $O_2$ or $HN_3$.

* * * * *